United States Patent [19]

Stupp et al.

[11] 4,247,352

[45] Jan. 27, 1981

[54] METHOD OF BONDING CRYSTAL LAYERS TO INSULATING SUBSTRATES

[75] Inventors: Edward H. Stupp, Spring Valley, N.Y.; Andrew A. Turnbull, Reigate, England

[73] Assignee: North American Philips Corporation, New York, N.Y.

[21] Appl. No.: 745,960

[22] Filed: Nov. 29, 1976

[51] Int. Cl.³ ............................................. H01J 29/45
[52] U.S. Cl. .................................. 156/272; 156/306.3; 156/308.8; 313/388; 357/31; 357/66; 427/58; 427/74; 427/124
[58] Field of Search .......................... 427/58, 74, 124; 156/305, 307, 272; 313/388; 357/66, 31, 28; 29/458

[56] References Cited

U.S. PATENT DOCUMENTS

| 3,769,136 | 10/1973 | Ospelt | 156/307 |
| 3,873,872 | 3/1975 | Conklin et al. | 313/388 |
| 3,901,755 | 8/1975 | Martin et al. | 156/307 |
| 4,053,806 | 10/1977 | Turnbull et al. | 313/388 |

FOREIGN PATENT DOCUMENTS

| 1233162 | 5/1971 | United Kingdom | 313/388 |
| 1399081 | 6/1975 | United Kingdom | 313/388 |

*Primary Examiner*—Harris A. Pitlick
*Attorney, Agent, or Firm*—T. A. Briody; D. R. Treacy; Marc D. Schechter

[57] ABSTRACT

A surface of an insulating substrate, if not wettable, is made wettable, then moistened with water and brought in intimate contact with a water soluble crystal layer, whereby a strong bond between the crystal and the substrate will result.

8 Claims, No Drawings

METHOD OF BONDING CRYSTAL LAYERS TO INSULATING SUBSTRATES

This invention relates generally to a method of attaching soluble crystals to insulating supporting structures. More specifically, this invention relates to the bonding of pyroelectric detectors or pyroelectric vidicon targets on thin polymer, glass, or other insulating substrates.

A technique for forming a pyroelectric vidicon (PEV) target on an insulating substrate is described in Patent 4,053,806.

In this technique, a polyimide (Pyre-ML) is made wettable by sequential depositions of ultrathin (in the order of few hundred Angstroms) layers of Cr and $MgF_2$. The PEV target of polycrystalline TGS (triglycine sulfate) is deposited from a water solution of the TGS by evaporation of the water. The polycrystalline TGS is strongly adherent to the surface. Among other alternate wetting techniques, deposited films of aluminum, presumably surface oxidized, will also be satisfactory.

This method has the requirement that the PEV target be formed from solution. In accordance with our invention, we provide a simple, clean method of attaching prefabricated TGS pyroelectric vidicon targets or other soluble crystals to ultra-thin supporting structures by using a minimum amount of water sufficient only to dissolve the contact surface of the material sufficient to produce a bond. Thus, this method can be used for attaching monocrystals or solid polycrystalline films to a substrate.

In one embodiment of this invention, the method has been tried with single crystal TGS on glass, supported polymers, and unsupported polymers. The surfaces, if not already wettable, were made wettable by the application of the aforementioned ultra-thin Cr and $MgF_2$ films and then a small amount of water sufficient only to form a thin film was added on the surface. The excess water was then centrifuged from the surface on a photoresist spinner and then the TGS was placed on the wet substrate. Additional centrifuging has provided a strong bond between the TGS and the substrate. Inspection of the periphery of the bonded films has revealed some dissolved TGS. The bond appeared to be the result of wetting of the substrate by the TGS saturated aqueous medium. Instead of centrifuging after the pyroelectric target is in place, the bond can be formed by applying an electric field across the substrate - target system. Because of the polar nature of PEV targets, dipole fields are formed when the field is applied. The dipole charges on the substrate is attractive to the PEV target. The large forces that result compress the target to the substrate thus expelling the excess moisture.

In another embodiment, a polymer substrate, such as, for example a membrane of polyimide (DuPont trade name Pyre-ML) is made wettable by applying on its surface ultrathin layers of a wettable material such as, Cr and $MgF_2$; then the wettable substrate is brought in intimate contact with a solid TGS film. Subsequently, the substrate is supported on its periphery and the opposite side of the film is exposed to a moist atmosphere. Water permeation through the film will produce enough dissolution of the TGS to provide the bond.

These techniques are extendable to any water soluble pyroelectric target materials such as, for example, triglycine fluoroberyllate, or deuterated triglycine fluoroberyllate.

Having thus described the invention, we wish it to be understood that we do not desire to be limited to the exact details of the process shown and described, for obvious modifications to occur to a person in the art. What we claim is to be new and desire to be secured by Letters Patent, is as follows:

1. A method of attaching a water soluble single crystal of pyroelectric material to a wettable insulating substrate; comprising the steps of forming a thin film of water on the substrate, placing the crystal on the substrate with the film of water thereon, and removing the excess water to produce the bond.

2. A method as claimed in claim 1, further comprising the steps of keeping a periphery-supported substrate in intimate contact with the crystal and then exposing the outer side of the substrate to a moist atmosphere until water penetrates through the substrate to provide the bond.

3. A method as claimed in claim 1, wherein said substrate is of polyimide polymer.

4. A method as claimed in claim 3, wherein said crystal is selected from the group consisting of triglycine sulfate, triglycine fluoroberyllate and deuteroted triglycine fluoroberyllate.

5. A method as claimed in claim 1, wherein the substrate surface is made wettable by sequential deposition of ultra-thin layers of Cr and $MgF_2$.

6. A method as claimed in claim 5, wherein the thickness of said ultra-thin layers is in the order of few hundreds Angstroms.

7. A method as claimed in claim 1, wherein the excess moisture is removed by centrifuging.

8. A method as claimed in claim 7, wherein an external electric field is placed across the crystal layer and the substrate sufficient to form dipole fields therein whereby the pressure resulting from electric attraction expels the excess moisture.

* * * * *